(12) United States Patent
Nayebpanah et al.

(10) Patent No.: US 12,278,624 B2
(45) Date of Patent: Apr. 15, 2025

(54) LOGIC CIRCUIT FOR PROVIDING A SIGNAL VALUE AFTER A PREDETERMINED TIME PERIOD AND METHOD OF USING SAME

(71) Applicant: Pratt & Whitney Canada Corp., Longueuil (CA)

(72) Inventors: Nastaran Nayebpanah, Brossard (CA); Jeffrey Weinstein, Cote St. Luc (CA)

(73) Assignee: PRATT & WHITNEY CANADA CORP., Longueuil (CA)

( * ) Notice: Subject to any disclaimer, the term of this patent is extended or adjusted under 35 U.S.C. 154(b) by 569 days.

(21) Appl. No.: 17/670,128

(22) Filed: Feb. 11, 2022

(65) Prior Publication Data
US 2023/0261649 A1 Aug. 17, 2023

(51) Int. Cl.
| | |
|---|---|
| *H03K 17/56* | (2006.01) |
| *G06F 9/44* | (2018.01) |
| *G06F 30/327* | (2020.01) |
| *H03K 5/01* | (2006.01) |
| *G06F 9/4401* | (2018.01) |
| *G06F 9/445* | (2018.01) |
| *H03K 5/00* | (2006.01) |

(52) U.S. Cl.
CPC ............ *H03K 17/56* (2013.01); *G06F 30/327* (2020.01); *H03K 5/01* (2013.01); *G06F 9/4411* (2013.01); *G06F 9/44505* (2013.01); *H03K 2005/00078* (2013.01)

(58) Field of Classification Search
CPC .. G06F 30/327; G06F 9/4411; G06F 9/44505; G06F 9/9152; H03K 17/56; H03K 5/01; H03K 2005/00078

USPC ........... 716/104; 709/248; 710/8, 25, 33, 62, 710/72; 326/21, 41, 47, 101
See application file for complete search history.

(56) References Cited

U.S. PATENT DOCUMENTS

| | | | | | |
|---|---|---|---|---|---|
| 3,845,324 | A | * | 10/1974 | Feucht | H03K 19/01714 326/119 |
| 3,851,258 | A | * | 11/1974 | Freedman | H03K 21/00 327/237 |
| 4,638,183 | A | * | 1/1987 | Rickard | H03K 3/35606 327/197 |
| 4,691,122 | A | * | 9/1987 | Schnizlein | G11C 19/28 377/80 |
| 4,800,300 | A | * | 1/1989 | Walters, Jr. | H03K 3/356104 327/210 |
| 5,216,299 | A | * | 6/1993 | Wanlass | H03K 3/356017 326/103 |
| 5,424,654 | A | * | 6/1995 | Kaplinsky | H03K 17/693 326/40 |
| 5,689,257 | A | * | 11/1997 | Mercer | H03K 17/04106 327/51 |

(Continued)

OTHER PUBLICATIONS

EP Search Report for EP Patent Application No. 23156407.1 dated Jul. 7, 2023.

*Primary Examiner* — Phallaka Kik
(74) *Attorney, Agent, or Firm* — Getz Balich LLC

(57) ABSTRACT

A logic circuit includes a timer and a plurality of switch assemblies in signal communication with the timer. Each switch assembly of the plurality of switch assemblies includes a switch including a true input gate, a false input gate, and an output gate, a first delay in signal communication with the output gate, and a second delay in signal communication between the output gate and the false input gate.

17 Claims, 4 Drawing Sheets

(56) References Cited

U.S. PATENT DOCUMENTS

| | | | | |
|---|---|---|---|---|
| 5,783,949 | A * | 7/1998 | Reohr | G11C 8/10 |
| | | | | 365/230.06 |
| 5,920,222 | A * | 7/1999 | Eustis | H03K 5/15046 |
| | | | | 327/277 |
| 5,973,508 | A * | 10/1999 | Nowak | H03K 19/018521 |
| | | | | 326/86 |
| 6,335,885 | B1 * | 1/2002 | Shimizu | G11C 5/143 |
| | | | | 365/233.5 |
| 6,356,102 | B1 * | 3/2002 | Klein | H03K 17/164 |
| | | | | 326/27 |
| 6,529,040 | B1 * | 3/2003 | Carberry | H03K 19/1737 |
| | | | | 326/46 |
| 6,741,111 | B1 * | 5/2004 | Wu | H03K 3/0372 |
| | | | | 327/201 |
| 6,822,885 | B2 * | 11/2004 | Bunce | G06F 12/0895 |
| | | | | 365/45 |
| 6,937,082 | B2 | 8/2005 | Ishimi | |
| 7,564,263 | B2 * | 7/2009 | Walker | H03K 3/356113 |
| | | | | 365/189.11 |
| 8,054,098 | B2 | 11/2011 | Koushanfar | |
| 9,471,094 | B1 | 10/2016 | Brahmadathan | |
| 10,824,161 | B2 | 11/2020 | Aiba | |
| 10,877,541 | B1 | 12/2020 | Benjamin | |
| 10,958,255 | B1 | 3/2021 | Asa | |
| 12,095,366 | B2 * | 9/2024 | Plojhar | H02M 3/156 |
| 12,130,654 | B2 * | 10/2024 | Javidi | G11C 7/1087 |
| 2005/0184782 | A1 * | 8/2005 | Sharma | H03K 3/3565 |
| | | | | 327/205 |
| 2008/0180139 | A1 * | 7/2008 | Natonio | H03K 3/35625 |
| | | | | 327/218 |
| 2008/0258775 | A1 * | 10/2008 | Wendell | H03K 3/35613 |
| | | | | 326/121 |
| 2009/0108885 | A1 * | 4/2009 | Natonio | H03K 3/35625 |
| | | | | 327/202 |
| 2013/0260485 | A1 * | 10/2013 | van der Wagt | H01L 22/34 |
| | | | | 257/E21.531 |
| 2014/0044311 | A1 | 2/2014 | Takahashi | |
| 2015/0205323 | A1 * | 7/2015 | Sambamurthy | H03K 19/20 |
| | | | | 327/116 |
| 2018/0108388 | A1 | 4/2018 | Bindra | |
| 2018/0170374 | A1 | 6/2018 | Otsuka | |
| 2021/0028776 | A1 * | 1/2021 | Bindra | H03K 5/13 |
| 2021/0351766 | A1 * | 11/2021 | Kawakami | H03K 3/35625 |
| 2024/0371430 | A1 * | 11/2024 | Kwak | H03K 3/037 |

* cited by examiner

| Time [sec] | S | A | B | C | D | TP | ULAT |
|---|---|---|---|---|---|---|---|
| 0 | 0 | 0 | 0 | 0 | 0 | 0 | 0 |
| 0.1 | 0 | 0 | 0 | 0 | 0 | 0 | 0 |
| 0.2 | 0 | 0 | 0 | 0 | 0 | 0 | 0 |
| 0.3 | 0 | 0 | 0 | 0 | 0 | 0 | 0 |
| 0.4 | 0 | 2 | 0 | 0 | 0 | 0 | 0 |
| 0.5 | 2 | 2 | 0 | 0 | 0 | 0 | 1 |
| 0.6 | 2 | 2 | 0 | 0 | 0 | 0 | 0 |
| 0.7 | 2 | 2 | 0 | 0 | 0 | 0 | 0 |
| 0.8 | 2 | 2 | 0 | 0 | 0 | 0 | 0 |
| 0.9 | 2 | 4 | 2 | 0 | 0 | 0 | 0 |
| 1.0 | 4 | 6 | 4 | 2 | 0 | 0 | 1 |
| ... | | | | | | | |
| 1.5 | 6 | 8 | 6 | 4 | 2 | 0 | 0 |
| ... | | | | | | | |
| 2.0 | 8 | 10 | 8 | 6 | 4 | 0 | 1 |
| ... | | | | | | | |
| 2.5 | 10 | 12 | 10 | 8 | 6 | 2 | 0 |
| ... | | | | | | | |
| 3.0 | 12 | 14 | 12 | 10 | 8 | 4 | 1 |
| ... | | | | | | | |
| 3.5 | 14 | 14 | 12 | 10 | 8 | 6 | 1 |

*FIG. 4*

LOGIC CIRCUIT FOR PROVIDING A SIGNAL VALUE AFTER A PREDETERMINED TIME PERIOD AND METHOD OF USING SAME

TECHNICAL FIELD

This disclosure relates generally to processing systems for gas turbine engines and more particularly to logic circuits configured for storing a signal value for a predetermined time period.

BACKGROUND OF THE ART

Control systems for gas turbine engines and other complex machinery must receive and store numerous electronic signals, and then process the electronic signals in an efficient manner. It some cases, it may be necessary to store electronic signal values for a predetermined period of time before they need to be read by the control system. Storage of the electronic signal values can require substantial amounts of storage capacity. Accordingly, systems and methods which reduce the storage capacity requirements for signal value storage are needed.

SUMMARY

It should be understood that any or all of the features or embodiments described herein can be used or combined in any combination with each and every other feature or embodiment described herein unless expressly noted otherwise.

According to an aspect of the present disclosure, a logic circuit includes a timer and a plurality of switch assemblies in signal communication with the timer. Each switch assembly of the plurality of switch assemblies includes a switch including a true input gate, a false input gate, and an output gate, a first delay in signal communication with the output gate, and a second delay in signal communication between the output gate and the false input gate.

In any of the aspects or embodiments described above and herein, the plurality of switch assemblies may include a first switch assembly and a second switch assembly and the first delay of the first switch assembly may be in signal communication between the output gate of the first switch assembly and the true input gate of the second switch assembly.

In any of the aspects or embodiments described above and herein, the plurality of switch assemblies may include a signal input and a signal output and the plurality of switch assemblies may be configured to provide a signal value of the signal input to the signal output after a predetermined N value of time delay.

In any of the aspects or embodiments described above and herein, the plurality of switch assemblies may include a leading switch assembly and one or more trailing switch assemblies and the true input gate of the switch of the leading switch assembly is in signal communication with the signal input.

In any of the aspects or embodiments described above and herein, the one or more trailing switch assemblies may include a terminal switch assembly and the first delay of the terminal switch assembly may be in signal communication with the signal output.

According to another aspect of the present disclosure, a processing system includes a non-transitory computer-readable storage medium having stored thereon software instructions and a processor configured to execute the software instructions over a plurality of sequential software execution cycles. Each software execution cycle of the plurality of sequential software execution cycles has a predetermined software execution time DT. The processing system further includes a logic circuit in signal communication with the processor. The logic circuit includes a timer and a plurality of switch assemblies comprising M number of switch assemblies. The plurality of switch assemblies is in signal communication with the timer. Each switch assembly of the plurality of switch assemblies includes a switch including a true input gate, a false input gate, and an output gate, a first delay in signal communication with the output gate, and a second delay in signal communication between the output gate and the false input gate.

In any of the aspects or embodiments described above and herein, the plurality of switch assemblies may include a signal input and a signal output. The plurality of switch assemblies may be configured to provide a signal value of the signal input to the signal output after a predetermined N value of time delay.

In any of the aspects or embodiments described above and herein, the signal output may be in signal communication with the processor.

In any of the aspects or embodiments described above and herein, the processor may be configured to use the signal value during execution of the software instructions.

In any of the aspects or embodiments described above and herein, the logic circuit may be configured to update the signal output at an interval corresponding to a timer constant TM of the timer. The timer constant TM may be substantially equal to the predetermined N value of time delay divided by the M number of switch assemblies.

In any of the aspects or embodiments described above and herein, the M number of switch assemblies may be greater than or equal to two.

In any of the aspects or embodiments described above and herein, the predetermined software execution time DT may have a value between 1 millisecond and 5 seconds.

In any of the aspects or embodiments described above and herein, the first delay and the second delay may be configured to provide a time delay corresponding to one iteration of the predetermined software execution time DT.

According to another aspect of the present disclosure, a method for providing a signal value to a signal output after a predetermined time period includes executing software instructions with a processor over a plurality of sequential software execution cycles. Each software execution cycle of the plurality of software execution cycles has a predetermined software execution time DT. The method further includes providing an output signal to the processor with a logic circuit. Providing the output signal to the processor includes providing a signal value of a signal input of the logic circuit to the processor via a signal output after a predetermined N value of time delay.

In any of the aspects or embodiments described above and herein, the logic circuit may include a timer and a plurality of switch assemblies in signal communication with the timer. Each switch assembly of the plurality of switch assemblies may include a switch including a true input gate, a false input gate, and an output gate, a first delay in signal communication with the output gate, and a second delay in signal communication between the output gate and the false input gate.

In any of the aspects or embodiments described above and herein, the method may further include updating the output signal at an interval corresponding to a timer constant TM of the timer.

In any of the aspects or embodiments described above and herein, the predetermined software execution time DT may have a value between 1 millisecond and 5 seconds.

In any of the aspects or embodiments described above and herein, the first delay and the second delay may be configured to provide a time delay corresponding to one iteration of the predetermined software execution time DT.

In any of the aspects or embodiments described above and herein, the plurality of switch assemblies may include a leading switch assembly and one or more trailing switch assemblies and the true input gate of the switch of the leading switch assembly may be in signal communication with the signal input.

In any of the aspects or embodiments described above and herein, the one or more trailing switch assemblies may include a terminal switch assembly and wherein the first delay of the terminal switch assembly is in signal communication with the signal output.

The present disclosure, and all its aspects, embodiments and advantages associated therewith will become more readily apparent in view of the detailed description provided below, including the accompanying drawings.

DESCRIPTION OF THE DRAWINGS

FIG. 4 illustrates a variable table for the logic circuit of FIG. 3, in accordance with one or more embodiments of the present disclosure.

DETAILED DESCRIPTION

Figure 1:
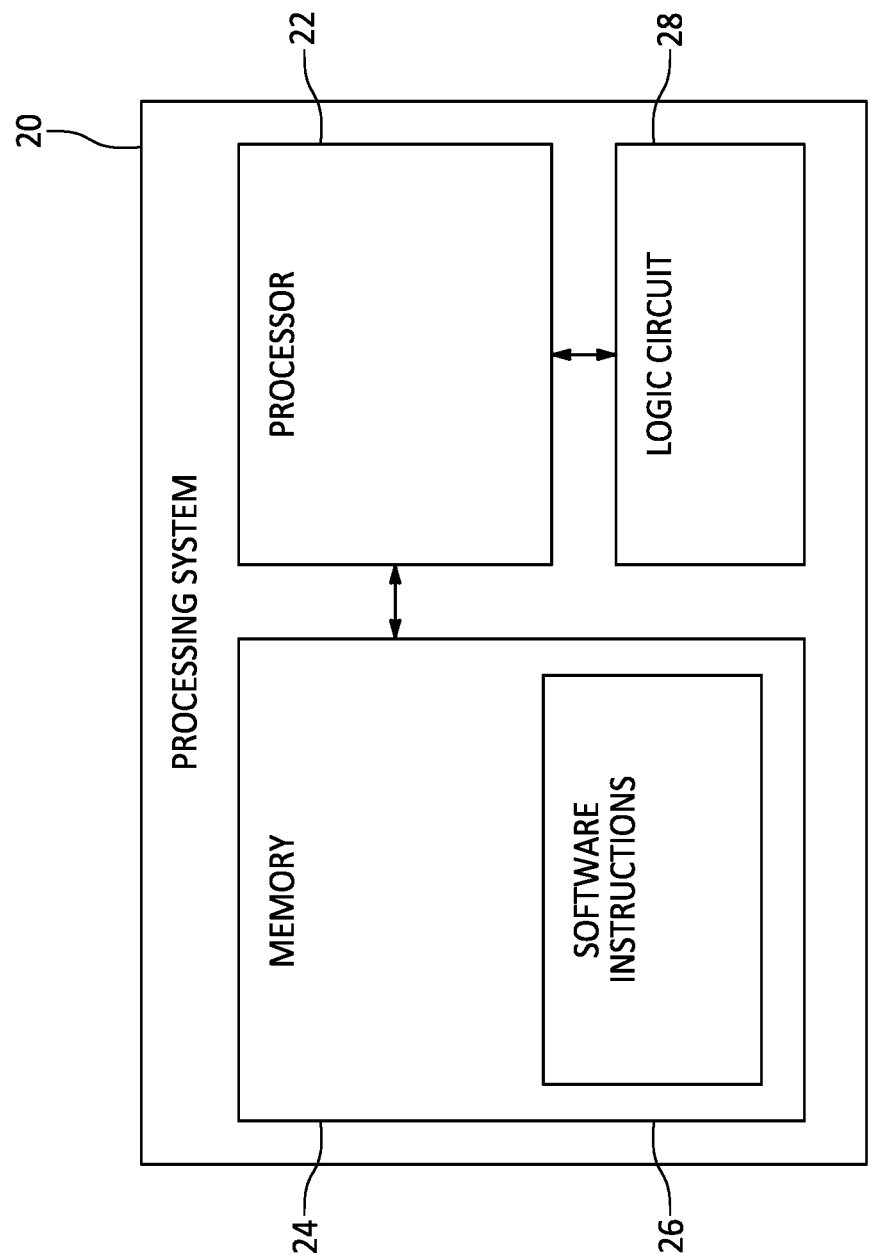
FIG. 1 illustrates a block diagram of a processing system, in accordance with one or more embodiments of the present disclosure.

Referring to FIG. 1, a block diagram of an exemplary processing system 20 is shown. The processing system 20 may be configured to implement one or more aspects of the present disclosure, however, the present disclosure is not limited to the particular processing system configuration shown in FIG. 1. The processing system 20 includes a processor 22 in signal communication with memory 24. The processor 22 may be any type of computing device, computational circuit, or processing circuit capable of executing a series of instructions that are stored in memory 24. The processor 22 may include multiple processors and/or multicore CPUs and may include any type of processor, such as a microprocessor, digital signal processor, co-processors, a micro-controller, a microcomputer, a central processing unit, a field programmable gate array, a programmable logic device, a state machine, logic circuitry, analog circuitry, digital circuitry, etc., and any combination thereof.

The memory 24 includes instructions stored therein. The instructions may represent one or more algorithms for controlling the aspects of the processing system 20, and the stored instructions are not limited to any particular form (e.g., program files, system data, buffers, drivers, utilities, system programs, etc.) provided they can be executed by the processor 22. For example, the memory 24 may include software instructions 26 stored therein, which may be read and executed by the processor 22. The memory 24 may be a non-transitory computer readable storage medium configured to store instructions that when executed by the processor 22, cause the processor 22 to perform or cause the performance of certain functions. The memory 24 may be a single memory device or a plurality of memory devices. A memory device may include a storage area network, network attached storage, as well as a disk drive, a read-only memory, random access memory, volatile memory, non-volatile memory, static memory, dynamic memory, flash memory, cache memory, and/or any device that stores digital information. One skilled in the art will appreciate, based on a review of this disclosure, that the implementation of the processing system 20 may be achieved by the use of hardware, software, firmware, or any combination thereof.

The processor 22 may execute the software instructions 26 stored in memory 24 in a plurality of sequential software execution cycles. The software execution cycles may typically be performed as a fetch-execute cycle in which the processor 22 fetches the software instructions 26 from the memory 24, the processor 22 decodes the software instructions 26, and the processor 22 executes the software instructions 26. Once a software execution cycle is completed, the processor 22 begins a new software execution cycle until there are no additional software instructions. Each software execution cycle may have a predetermined software execution time DT which may be substantially constant among the plurality of software execution cycles for the given processor 22 and software instructions 26. The predetermined software execution time DT may have a value between approximately 1 millisecond and approximately 5 seconds. However, the present disclosure is not limited to any particular value of the predetermined software execution time DT.

Figure 2:
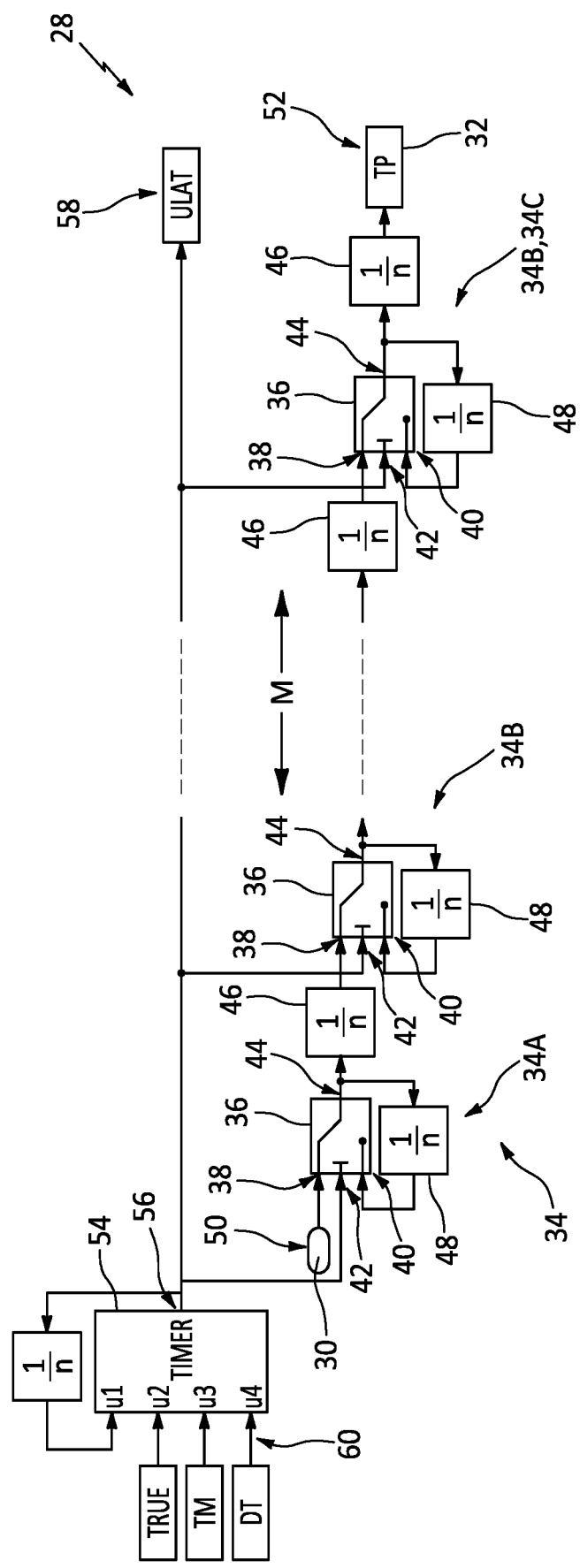
FIG. 2 illustrates a Boolean diagram of a logic circuit, in accordance with one or more embodiments of the present disclosure.

Referring to FIGS. 1 and 2, the processing system 20 includes at least one logic circuit 28. The logic circuit 28 is configured to receive an input signal 30 having an input signal value. The logic circuit 28 is further configured to provide an output signal 32, corresponding to the input signal value of the input signal 30, after a predetermined N value of time delay (e.g., N seconds). In other words, the logic circuit 28 is configured to provide a signal value as the output signal 32 after the predetermined N value of time delay. During execution of the software instructions 26, a detected condition, event, signal, or other occurrence may be determined based on one or more input signals to the processing system 20. The detected condition, event, signal, or other occurrence may cause the processing system 20 to evaluate the output signal 32. In other words, the processing system 20 may evaluate the signal value of the output signal 32 which is the same as the signal value of the input signal 30 from N seconds prior to the detected condition, event, signal, or other occurrence.

The output signal 32 may be received by the processor 22 and used by the processor 22 for execution of the software instructions 26. The logic circuit 28 may be implemented using one or more logic inputs, one or more logic outputs, and a plurality of logic gates such as, but not limited to, NAND gates, XOR gates, and the like. The present disclosure logic circuit 28 allows a processing system, such as the processing system 20, to obtain a signal value from N seconds prior using a combination of switches, as will be discussed in further detail. Moreover, the present disclosure logic circuit 28 may require less storage capacity than conventional processing structures, including array structures, to provide the signal value from N seconds prior. For example, for a memory array circuit to provide an output signal corresponding to a signal value of an input signal after a predetermined N value of time delay (e.g., N seconds), the memory array may require an array size of N seconds divided by an associated software execution time DT. Accordingly, the large size of a memory array circuit may, therefore, be undesirable for certain applications.

The logic circuit 28 includes a plurality of switch assemblies 34. The plurality of switch assemblies 34 includes M number of switch assemblies 34. As will be discussed in further detail, the value of M for the number of switch assemblies 34 may be selected to determine, at least in part, the value of N for the predetermined value of time delay of the logic circuit 28. Each switch assembly 34 includes a switch 36. The switch 36 includes a true input gate 38, a false input gate 40, and a toggle input gate 42. The switch 36 further includes an output gate 44. Each switch assembly 34 further includes a first delay 46 and a second delay 48. The first delay 46 is in signal communication with the output gate 44. As shown in FIG. 2, the first delay 46 for a first switch assembly 34 may be in signal communication between the output gate 44 for said first switch assembly 34 and the true input gate 38 for a second switch assembly 34 of the plurality of switch assemblies 34, which second switch assembly 34 is immediate downstream of the first switch assembly 34. The second delay 48 is in signal communication between the output gate 44 and the false input gate 40 for each switch assembly 34. The first delay 46 and the second delay 48 are configured to delay an input signal to the respective delay 46, 48 by one iteration of the predetermined software execution time DT.

The plurality of switch assemblies 34 includes a signal input 50 and a signal output 52. The signal input 50 is configured to receive the input signal 30. Similarly, the signal output 52 is configured to receive the output signal 32. The signal output 52 of the plurality of switch assemblies 34 may be in signal communication, directly or indirectly, with the processor 22. The plurality of switch assemblies 34 includes a leading switch assembly 34A and one or more trailing switch assemblies 34B. The true input gate 38 of the leading switch assembly 34A is in signal communication with the signal input 50. The true input gate 38 of each of the one or more trailing switch assemblies 34B is in signal communication with the first delay 46 of an immediately upstream switch assembly 34, as previously described. The one or more trailing switch assemblies 34B include a terminal switch assembly 34C. The first delay 46 of the terminal switch assembly 34C is in signal communication between the output gate 44 of the switch 36 for the terminal switch assembly 34C and the signal output 52.

The logic circuit 28 includes a timer 54. The timer 54 includes an output gate 56 in signal communication with the respective toggle input gate 42 of each switch assembly 34 of the plurality of switch assemblies 34. The timer 54 is configured to provide a logic flag signal 58 ("ULAT") at the output gate 56 which coordinates the operation of the plurality of switch assemblies 34. When the logic flag signal 58 is TRUE (e.g., a Boolean value of 1), each switch assembly 34 passes the signal at the respective true input gate 38 to the respective output gate 44. Thus, when the logic flag signal 58 is TRUE, the signal value of the output signal 32 provided to the signal output 52 is updated with a new signal value corresponding to the value of signal value of the input signal 30 from N seconds prior. When the logic flag signal 58 is FALSE (e.g., a Boolean value of 0), each switch assembly 34 passes the signal at the respective false input gate 40 to the respective output gate 44.

The timer 54 may receive one or more input signals 60 which determine the operational characteristics of the timer 54. The timer 54 may receive a timer constant TM which controls a cycle time (e.g., in seconds) for the timer 54. The timer constant TM is substantially equal to the predetermined N value of time delay divided by the M number of switch assemblies 34 (e.g., TM may be substantially equal to N/M). The timer 54 may also receive the predetermined software execution time DT, where the predetermined software execution time DT represents the predetermined execution time of each software execution cycle for the software instructions 26 executed by the processor 22. The timer 54 counts the sequential software execution cycles having the software execution time DT until the elapsed time is equal to the timer constant TM, at which point the timer 54 changes the logic flag signal 58 to TRUE. It should be understood that, in some embodiments, the logic circuit 28 may not update the output signal 32 at the time precisely corresponding to the timer constant TM and the output signal 32 may alternatively be updated as soon as the number of sequential software execution cycles multiplied by the software execution time DT is greater than or equal to the N/M seconds (i.e., the timer constant TM).

Figure 3:
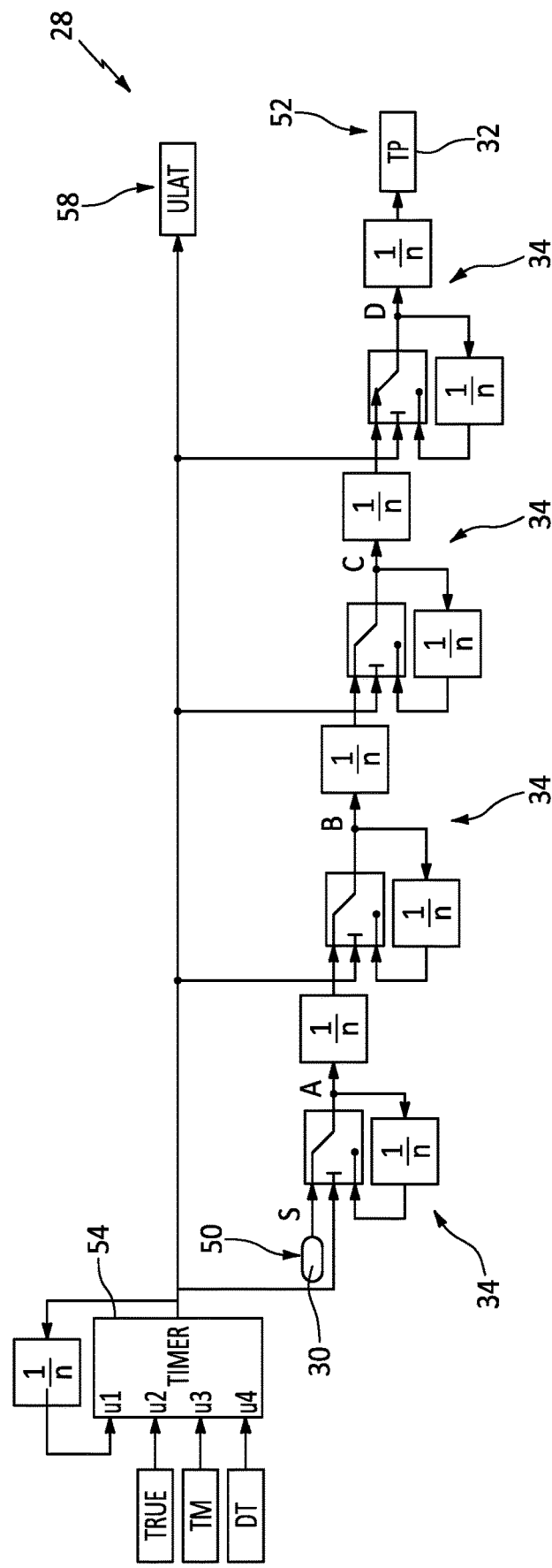
FIG. 3 illustrates a Boolean diagram of a logic circuit, in accordance with one or more embodiments of the present disclosure.

Referring to FIGS. 3 and 4, an exemplary embodiment of the logic circuit 28 is provided. The logic circuit 28 of FIG. 3 includes four switch assemblies 34 (e.g., M=4) and has a predetermined N value of time delay of two seconds (e.g., N=2 seconds). Accordingly, the timer 54 of the logic circuit 28 of FIG. 3 may have a timer constant TM of 0.5 seconds. The logic circuit 28 of FIG. 3 may, therefore, be used to provide signal values for a particular processor 22 and associated software instructions 26 (see FIG. 1) having a predetermined software execution time DT of approximately 0.1 seconds for the processing system 20.

FIG. 4 illustrates a value table showing signal values at various points (i.e., points S, A, B, C, D) of the logic circuit 28 of FIG. 3, for each iteration of the timer constant TM. In a first example of the operation of the logic circuit 28 of FIG. 3, the signal input 50 of the plurality of switch assemblies 34 receives the input signal 30 having a signal value of two (e.g., S=2) at 0.5 seconds. At approximately 2.5 seconds, the signal output 52 of the plurality of switch assemblies 34 receives the output signal 32 having the signal value of two (e.g., TP=2). Similarly, in a second example of the operation of the logic circuit 28 of FIG. 3, the signal input 50 of the plurality of switch assemblies 34 receives the input signal 30 having a signal value of four (e.g., S=4) at 1.0 seconds. At approximately 3.0 seconds, the signal output 52 of the plurality of switch assemblies 34 receives the output signal 32 having the signal value of four (e.g., TP=4).

It is noted that various connections are set forth between elements in the preceding description and in the drawings. It is noted that these connections are general and, unless specified otherwise, may be direct or indirect and that this specification is not intended to be limiting in this respect. A coupling between two or more entities may refer to a direct connection or an indirect connection. An indirect connection may incorporate one or more intervening entities. It is further noted that various method or process steps for embodiments of the present disclosure are described in the following description and drawings. The description may present the method and/or process steps as a particular sequence. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the description should not be construed as a limitation.

Furthermore, no element, component, or method step in the present disclosure is intended to be dedicated to the public regardless of whether the element, component, or method step is explicitly recited in the claims. No claim element herein is to be construed under the provisions of 35 U.S.C. 112 (f) unless the element is expressly recited using the phrase "means for." As used herein, the terms "comprises", "comprising", or any other variation thereof, are intended to cover a non-exclusive inclusion, such that a process, method, article, or apparatus that comprises a list of elements does not include only those elements but may include other elements not expressly listed or inherent to such process, method, article, or apparatus.

While various aspects of the present disclosure have been disclosed, it will be apparent to those of ordinary skill in the art that many more embodiments and implementations are possible within the scope of the present disclosure. For example, the present disclosure as described herein includes several aspects and embodiments that include particular features. Although these particular features may be described individually, it is within the scope of the present disclosure that some or all of these features may be combined with any one of the aspects and remain within the scope of the present disclosure. References to "various embodiments," "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described. Accordingly, the present disclosure is not to be restricted except in light of the attached claims and their equivalents.

The invention claimed is:

1. A logic circuit comprising:
 a timer having a time constant TM; and
 a plurality of switch assemblies comprising M number of switch assemblies, the plurality of switch assemblies in signal communication with the timer, the plurality of switch assemblies including a signal input and a signal output, the plurality of switch assemblies configured to provide a signal value of the signal input to the signal output after a predetermined N value of time delay, each switch assembly of the plurality of switch assemblies including:
  a switch including a true input gate, a false input gate, and an output gate;
  a first delay in signal communication with the output gate; and
  a second delay in signal communication between the output gate and the false input gate;
 wherein the timer constant TM is substantially equal to the predetermined N value of time delay divided by the M number of switch assemblies such that the plurality of switch assemblies is configured to update the signal output at an interval corresponding to the timer constant TM.

2. The logic circuit of claim 1, wherein the plurality of switch assemblies includes a first switch assembly and a second switch assembly and wherein the first delay of the first switch assembly is in signal communication between the output gate of the first switch assembly and the true input gate of the second switch assembly.

3. The logic circuit of claim 1, wherein the plurality of switch assemblies includes a leading switch assembly and one or more trailing switch assemblies and wherein the true input gate of the switch of the leading switch assembly is in signal communication with the signal input.

4. The logic circuit of claim 3, wherein the one or more trailing switch assemblies includes a terminal switch assembly and wherein the first delay of the terminal switch assembly is in signal communication with the signal output.

5. A processing system comprising:
 a non-transitory computer-readable storage medium having stored thereon software instructions;
 a processor configured to execute the software instructions over a plurality of sequential software execution cycles, each software execution cycle of the plurality of sequential software execution cycles having a predetermined software execution time DT; and
 a logic circuit in signal communication with the processor, the logic circuit including:
  a timer; and
  a plurality of switch assemblies comprising M number of switch assemblies, the plurality of switch assemblies in signal communication with the timer, the plurality of switch assemblies including a signal input and a signal output, the plurality of switch assemblies configured to provide a signal value of the signal input to the signal output after a predetermined N value of time delay, each switch assembly of the plurality of switch assemblies including:
   a switch including a true input gate, a false input gate, and an output gate;
   a first delay in signal communication with the output gate; and
   a second delay in signal communication between the output gate and the false input gate;
  wherein the logic circuit is configured to update the signal output at an interval corresponding to a timer constant TM of the timer, the timer constant TM is substantially equal to the predetermined N value of time delay divided by the M number of switch assemblies.

6. The processing system of claim 5, wherein the signal output is in signal communication with the processor.

7. The processing system of claim 6, wherein the processor is configured to use the signal value during execution of the software instructions.

8. The processing system of claim 5, wherein the M number of switch assemblies is greater than or equal to two.

9. The processing system of claim 5, wherein the predetermined software execution time DT has a value between 1 millisecond and 5 seconds.

10. The processing system of claim 5, wherein the first delay and the second delay are configured to provide a time delay corresponding to one iteration of the predetermined software execution time DT.

11. A processing system comprising:
 a non-transitory computer-readable storage medium having stored thereon software instructions;
 a processor configured to execute the software instructions over a plurality of sequential software execution cycles, each software execution cycle of the plurality of sequential software execution cycles having a predetermined software execution time DT; and
 a logic circuit in signal communication with the processor, the logic circuit including:
  a timer; and a plurality of switch assemblies comprising M number of switch assemblies, the plurality of switch assemblies in signal communication with the timer, the plurality of switch assemblies including a signal input and a signal output, the signal output is in signal communication with the processor, the plurality of switch assemblies configured to provide a signal value of the signal input to the signal output after a predetermined N value of time delay, each switch assembly of the plurality of switch assemblies including:
- a switch including a true input gate, a false input gate, and an output gate;
- a first delay in signal communication with the output gate; and
- a second delay in signal communication between the output gate and the false input gate;

wherein the logic circuit is configured to update the signal output at an interval corresponding to a timer constant TM of the timer, the timer constant TM is substantially equal to the predetermined N value of time delay divided by the M number of switch assemblies; and wherein the processor is configured to use the signal value during execution of the software instructions.

12. The processing system of claim 11, wherein the M number of switch assemblies is greater than or equal to two.

13. The processing system of claim 11, wherein the predetermined software execution time DT has a value between 1 millisecond and 5 seconds.

14. The processing system of claim 11, wherein the first delay and the second delay are configured to provide a time delay corresponding to one iteration of the predetermined software execution time DT.

15. The processing system of claim 11, wherein the plurality of switch assemblies includes a first switch assembly and a second switch assembly and wherein the first delay of the first switch assembly is in signal communication between the output gate of the first switch assembly and the true input gate of the second switch assembly.

16. The processing system of claim 11, wherein the plurality of switch assemblies includes a leading switch assembly and one or more trailing switch assemblies and wherein the true input gate of the switch of the leading switch assembly is in signal communication with the signal input.

17. The processing system of claim 16, wherein the one or more trailing switch assemblies includes a terminal switch assembly and wherein the first delay of the terminal switch assembly is in signal communication with the signal output.

* * * * *